(12) United States Patent
Gottscho

(10) Patent No.: US 11,276,564 B2
(45) Date of Patent: Mar. 15, 2022

(54) PLASMA PROCESSING SYSTEM HAVING AN INSPECTION TOOL AND CONTROLLER THAT INTERFACES WITH A TOOL MODEL

(71) Applicant: Lam Research Corporation, Fremont, CA (US)

(72) Inventor: Richard Alan Gottscho, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 159 days.

(21) Appl. No.: 16/392,525

(22) Filed: Apr. 23, 2019

(65) Prior Publication Data

US 2019/0252163 A1 Aug. 15, 2019

Related U.S. Application Data

(62) Division of application No. 15/657,088, filed on Jul. 21, 2017, now Pat. No. 10,269,545.

(Continued)

(51) Int. Cl.
  *H01J 37/32* (2006.01)
  *H01L 21/67* (2006.01)
  *G05B 19/418* (2006.01)

(52) U.S. Cl.
  CPC ...... *H01J 37/32926* (2013.01); *G05B 19/418* (2013.01); *H01J 37/3299* (2013.01);
  (Continued)

(58) Field of Classification Search
  None
  See application file for complete search history.

(56) References Cited

U.S. PATENT DOCUMENTS

| 5,716,878 A * | 2/1998 | Turner | G01N 27/60 |
| | | | 204/298.03 |
| 2001/0043984 A1 * | 11/2001 | Otsubo | C23C 16/52 |
| | | | 427/8 |

(Continued)

OTHER PUBLICATIONS

Setyawan, Heru et al., "Characterization of particle contamination in process steps during plasma-enhanced chemical vapor deposition operation", Aerosol Science 34 (Mar. 8, 2003) 923-936.

(Continued)

*Primary Examiner* — Rakesh K Dhingra
(74) *Attorney, Agent, or Firm* — Penilla IP, APC

(57) ABSTRACT

A system for use in processing a substrate is provided. One system includes a chamber having an interior region that is exposed to plasma when processing a substrate. The internal region includes surfaces of parts of the chamber. A controller is interfaced with the chamber and includes a detector to enable control of a scope. The scope is configured for insertion into the chamber to inspect the interior region of the chamber without breaking a vacuum of the chamber. The detector includes an optical processor for identifying a characteristic of material present on a surface being inspected via the scope. A tool model processor is configured to receive information regarding the identified characteristic of the material present on the surface and interface with a tool model for the chamber to identify an adjustment to a parameter of a process to be performed using the chamber. The adjustment is configured to compensate for an anticipated drift in the process based on the identified characteristic of the material present on the surface and data from the tool model.

17 Claims, 11 Drawing Sheets

Related U.S. Application Data

(60) Provisional application No. 62/370,658, filed on Aug. 3, 2016.

(52) U.S. Cl.
CPC .. *H01J 37/32853* (2013.01); *H01J 37/32935* (2013.01); *H01J 37/32972* (2013.01); *H01L 21/67253* (2013.01); *H01J 2237/332* (2013.01); *H01J 2237/334* (2013.01); *H01L 21/67069* (2013.01)

(56) References Cited

U.S. PATENT DOCUMENTS

| | | | |
|---|---|---|---|
| 2004/0065539 A1 | 4/2004 | Sosnowski | 204/164 |
| 2004/0125360 A1* | 7/2004 | Ludviksson | H01J 37/32963 356/72 |
| 2004/0253824 A1* | 12/2004 | Tegeder | C23C 16/52 438/696 |
| 2005/0009347 A1* | 1/2005 | Matsumoto | H01J 37/32935 438/689 |
| 2005/0031187 A1* | 2/2005 | Lin | H01L 21/67253 382/145 |
| 2005/0217795 A1 | 10/2005 | Avoyan | 156/345.28 |
| 2007/0242269 A1 | 10/2007 | Trainer | 356/336 |
| 2008/0124200 A1* | 5/2008 | Lee | H01L 21/68742 414/217.1 |
| 2009/0112515 A1* | 4/2009 | Sugimoto | H01L 21/67253 702/179 |
| 2015/0214016 A1* | 7/2015 | Ham | C23C 16/4405 216/60 |
| 2016/0198558 A1* | 7/2016 | Chan | H05H 1/0081 356/72 |
| 2016/0216100 A1 | 7/2016 | Kim | |

OTHER PUBLICATIONS

Yu, Xiao-Chong, et al., "Optically sizing single atmospheric particulates with a 10-nm resolution using a strong evanescent field". Light: Science & Applications (Jan. 2, 2018) 7, 18003, pp. 1-7.

Lai, Alvin C., et al., "Particle Deposition and Decay in a Chamber and the implications to Exposure Assessment". Water, Air, and Soil Pollution (Mar. 11, 2006) 175: 323-334.

Zhang, Xiaodong, et al., "New insight into particulate mineral and organic matter in coastal ocean waters through optical inversion", Estaurine, Coastal, and Shelf Service 149 (Mar. 27, 2014) 1-12.

Peill, Nicola J., et al., "Development and Optimization of a TiO2-Coated Fiber-Optic Cable Reactor; Photocatalytic Degradation of 4-Chlorophenol", Environ. Sci. Technol. (Sep. 1, 1995), 29, 2974-2981.

Bohannon, J. Kyle, et al., "Generation and characterization of large-particle aerosois using a center flow tangential aerosol generator with a nonhuman-primate, head-only aerosol chamber". Inhal. Toxicol, 2015; 27(5): 247-253. Aug. 15, 2016.

\* cited by examiner

Discrete Positioning

Scan Positioning

PLASMA PROCESSING SYSTEM HAVING AN INSPECTION TOOL AND CONTROLLER THAT INTERFACES WITH A TOOL MODEL

CLAIM OF PRIORITY

This Application is a Divisional of and claims benefit and priority to U.S. application Ser. No. 15/657,088, filed on Jul. 21, 2017 (U.S. Pat. No. 10,269,545, issued on Apr. 23, 2019), entitled "Methods for Monitoring Plasma Processing Systems For Advanced Process and Tool Control," which further claims priority to U.S. Provisional Application No. 62/370,658, filed on Aug. 3, 2016, entitled "Methods and Systems for Monitoring Plasma Processing Systems and Advanced Process and Tool Control," which are herein incorporated by reference.

FIELD OF THE INVENTION

The present embodiments relate to methods and computer implemented processes for constructing tool models used for inspecting interior regions of a process tool and using captured information to actively make adjustments to one or more parameters of a process being executed by the process tool, and methods for using tool model data to predict process performance and execute active adjustments. The methods described herein further relate to inspection techniques that are useful to extend useful operation of a process tool between tool wet clean operations.

BACKGROUND

Plasma has long been employed to process substrates (e.g., wafers or flat panels) to form electronic products (e.g., integrated circuits or flat panel displays). Semiconductor wafers are typically placed in an etch chamber with a photoresist mask layer to direct the etch of the underlying materials. The etching process removes the underlying materials not covered by the photoresist. The etch process may also remove material from the surfaces of parts within the plasma chamber. Over time, the parts inside the processing chamber may accumulate particulate matter and/or etch residues, which may alter the etch performance. For this reason, in addition to the need to replace consumable parts, there is also a need to perform wet clean operations (i.e., of the inside surfaces of chambers), periodically.

After a wet clean, the chamber must be reconditioned through various steps/processes (i.e., processed for wet clean recovery) before the chamber is allowed to proceed with production wafer processing. As a result, wet clean recovery is problematical. It is also difficult to match tools and getting more difficult. Tool matching is not just a matter of matching etch rate monitors but also profiles, uniformity of profiles, CDs, defects, etc. As a result, wet cleans take a long time even when executed well with lots of idle time awaiting metrology. Energy consumption is wasted during this time. Fabrication production time is also lost.

Part of the wet clean recovery procedure involves seasoning the chamber. This process attempts to produce surface conditions that mimic a steady state. When steady state is achieved, the solution tends to be brittle, i.e. it is not always universal from process to process or chamber to chamber. This requires expensive re-development procedures. Perhaps even worse, the seasoning itself can be a significant fraction of the total tool utilization, e.g. seasoning for 40 hours while the process only runs for 150-250 hours. Obviously, this is a productivity hit, not to mention again wasted energy consumption, cost of seasoning wafers, and high cost of consumables as they wear just to season them.

Waferless auto cleans (WACs) and pre-coats suffer from similar challenges. Systems are sometimes over-cleaned and over-pre-coated to enable mixed runs, stable operation, low defects, low metal contamination. The optimization of these procedures is necessarily done late in the development cycle, as it is too complicated to optimize them as recipes and wafer stacks are in flux.

It is in this context that embodiments arise.

SUMMARY

Methods, devices, systems, and computer programs are presented for constructing tool models used for inspecting conditions inside of plasma chambers, inspecting conditions of surfaces, and providing closed loop controls to adjust parameters of recipes to maintain processing performance within expected performance windows. Several embodiments are described below.

In one embodiment, a method for operating a plasma processing chamber is provided. The method includes processing a substrate in the plasma processing chamber under vacuum. The processing of said substrate producing particulate residues that adhere to surfaces within an internal region of the plasma processing chamber. The method includes characterizing performance of the processing of the substrate and inspecting an internal region of the plasma processing chamber after processing said substrate without breaking said vacuum. The inspecting is configured to identify characteristics of said particulate residues on one or more surfaces of the internal region of the plasma processing chamber. The inspecting includes capturing optical data of said one or more surfaces. The method further includes generating a tool model to correlate the characterized performance of the processing of the substrate to the characterized particulate residues. In one configuration, the tool model is optimized by repeating the inspections a plurality of times. The tool model is then usable for later inspecting internal surfaces of the chamber and providing a closed loop control to adjust at least one parameter of a recipe, based on anticipated performance of the recipe as identified from the tool model.

In another embodiment, a method for operating a plasma processing chamber is provided. The method includes identifying a recipe for processing a substrate in the plasma processing chamber. The recipe identifies parameters for chemistries to be supplied and conditions of the plasma processing chamber to be used for said processing, and said processing is configured to produce a predefined level of performance. The method includes inspecting an inside region of the plasma processing chamber with a scope to determine a physical condition of a surface within the inside region. Then, referencing a tool model for the plasma processing chamber. The tool model is associated with the recipe used for processing the substrate. The method also includes adjusting at least one of said parameters of the recipe based on information provided by the tool model that corresponds to the physical condition determined based on the inspection. The adjusting is configured to substantially prevent a drift in a metric of performance that is outside of the predefined level of performance.

In yet another embodiment, plasma processing system is disclosed. The system includes a chamber having an interior region that is exposed to plasma when processing a substrate. The internal region has surfaces of structures of the chamber and surfaces of consumable parts of the chamber.

A controller is interfaced with the chamber for controlling processing of a recipe to be used when processing the substrate, and the recipe defines a plurality of parameters to be set for supplying chemistries and setting conditions of the chamber. A detector module is interfaced with the chamber to enable control of a scope. The scope is configured for insertion into the chamber to inspect the interior region of the chamber without breaking a vacuum of the chamber. The detector module includes an optical processor for controlling application of light toward a surface of the internal region of the chamber and detecting reflected light. The reflected light is processed by an optical processor to identify a characteristic of material present on the surface being inspected via the scope. A positioning system is provided for moving the scope to one or more locations of the internal region of the chamber. The positioning system is configured to move the scope into the internal region in between processing of substrates and move the scope out of the internal region during processing of substrates. A tool model processor is provided to receive information regarding the identified characteristic of the material present on the surface and information regarding a process performance of the recipe obtained from an inspection of one or more substrates to construct a tool model. The tool model maintains correlations between the characteristic of the material present on the surface and information regarding the process performance of the recipe. The tool model is updated by the tool model processor when processing one or more additional substrates.

The tool model, once constructed, is further usable to periodically inspect one or more substrates during processing, and to enable closed loop control adjustments to one or more parameters of the recipe. Adjusting the recipe enables maintaining the processing of substrates within a predefined level of performance or window, even though conditions of surfaces inside the chamber are continually changing. Advantageously, use of the tool model further enables extending operation of the chamber for larger periods of time before a next wet clean is performed.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1:
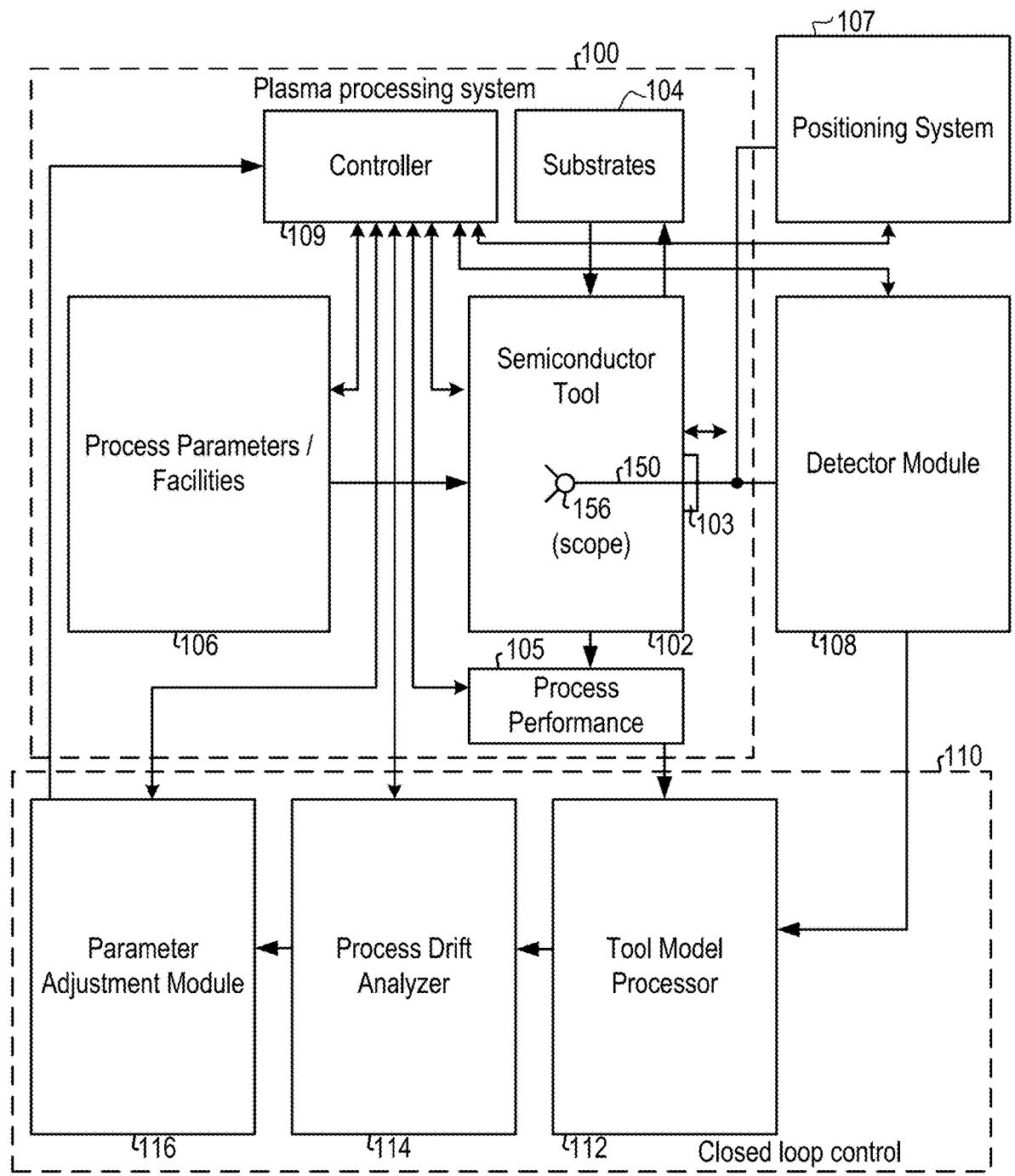
FIG. 1 provides a block diagram in which a semiconductor tool is part of a plasma processing system, in accordance with one embodiment.

The following embodiments describe methods, devices, systems, and computer programs for monitoring plasma processing systems, and in particular, plasma processing tools used to process semiconductor substrates, e.g., wafers.

In one embodiment, a physical model (i.e., a tool model) is constructed for what is happening inside to a chamber after a wet clean and production of wafers progresses. In one example, the tool model is for characterizing the surfaces, which may be new and/or clean, or placed parts, or used parts. The tool model considers changes in the surfaces after substrates have been plasma processed. The changes occur, e.g., due to material build-up, reactive byproducts accumulating on surfaces, and surface characteristic changes, e.g., due to wear and/or textures. Further, surface reactions can occur, which determine fluxes of reactive species (e.g., ions, radicals, electrons) to wafers.

In one embodiment, the tool model can be simplified into a group of lumped parameters that will be a function of initial state of surfaces, process chemistry, reactor geometry, and other characteristics. The tool model can then be calibrated using a wealth of data gathered by a scope inserted into the chamber for inspection. Over time, more data can be gathered, e.g., after processing more and more wafers, which can assist in optimizing the tool model. In some embodiments, other sensors of the chamber can also be used to gather additional data. These sensors can include, for example, vat valve, optical emission spectroscopy (OES) spectra, current/voltage (IV) characteristics via probes, harmonic content, etc. These measurements of data can be real-time, and can be fed to the tool model to refine its performance. In some embodiments, machine learning algorithms can be implemented to minimize calibration efforts and/or simplify the tool model of the physical chamber.

In some embodiments, if a tool is calibrated to define a tool module, the process is preferably less time consuming than current tool seasoning procedures. As will be described below, the tool model, calibrated as noted herein, can be used to adjust recipes on the fly, such that after a short calibration/seasoning, production can be run with minimal WACs/pre-coats/seasoning, and acceptable process performance is achieved.

In some embodiments, a scope is used to detect physical characteristics of a process tool to identify material build-up of residues (e.g., plasma processing polymers) on surfaces inside the process tool, identify uniformity or non-uniformity of such residues, identify wear level of consumable parts inside the process tool, and physical tool characteristics. This information is, in one embodiment, detected in between substrate processing operations, e.g., during the time a substrate is removed and before a next substrate is introduced into the process tool. As substrates continue to be processed in the process tool, metrics characterizing physical changes of residue build-up, uniformity of residues, non-uniformity of residues, part wear, are saved to a database for analysis.

In one embodiment, a database is also configured for collection of metrics related to process performance, e.g., etch rate uniformity, critical dimension (CD) performance, and associated drift in performance over time, and other parameters. Analysis of the metrics related to physical changes in the tool and process performance will enable construction of a tool model. The tool model is configured to produce relationships, which are reinforced over time, by learning how changes in specific surfaces, parts, wear, residue build-up, residue characteristics, etc., will impact process performance. As more and more substrates are processed, the tool model will continue to refine, which will enable more accurate correlation to certain physical changes to resulting process performance. In one embodiment, the tool model is used for dynamic feedback to adjust process parameters.

By way of example, process parameter adjustments can be automatically made or recommended, in order to cause an adjustment in process performance. The process parameter may be, for example, a flow rate of a certain etchant, or a pressure setting, or a power level, or a temperature setting, etc. Accordingly, by harnessing information assembled as part of the tool model over time, it is possible to dynamically adjust process parameters of a process tool, so that the process performance stays within a desired range for a longer operational period (e.g., enabling processing of more substrates before a next clean operation and/or consumable part replacement is required).

In one embodiment, a scope is used to inspect the inside of a plasma chamber without opening the chamber to atmosphere, as is routinely done today in semiconductor manufacturing. Opening the chamber to atmosphere results in lost productivity and often pre-mature replacement of consumable parts if the part's lifetimes and time between clean (TBC) are not synchronized. Moreover, when the chamber is opened to atmosphere, deposits on the chamber walls are typically altered by reaction with atmospheric constituents such as oxygen, nitrogen, and water. As mentioned above, embodiments described herein describe a tool model that characterizes how a plasma chamber evolves during the processing of multiple substrates, e.g., between wet clean cycles and/or waferless auto cleans (WACs). In one embodiment, the tool model characterizes the insides of a process chamber without opening it to atmosphere.

Monitoring how a chamber is evolving between wet clean cycles, as mentioned above, can produce metrics that characterize or identify how particulate matter (e.g., etch by-produces/residues) are adhering to certain parts and/or locations of the inside of the plasma chamber, where adhesion of such particulate matter is behaving, how geometries in the chamber are likely to accumulate more or less particulate matter, and/or how certain geometries in the chamber are conducive to build-up of residues. Furthermore, embodiments described herein enable use of the scope after processing each substrate to precisely track the progression of particulate matter buildup, consumable part wear or failure, etc. In other embodiments, the scope can be used periodically after a certain number of substrates are processed. In still other embodiments, the scope can be used after a lot of substrates are processed. In another embodiment, the scope can be used on-demand, e.g., when an operator needs to characterize the internal physical surfaces of the chamber.

In one embodiment, the scope is inserted into a process chamber, while the process chamber is still in vacuum (e.g., during substrate transfers in and out). In another embodiment, the scope may be inserted and positioned in various angles, view directions, scanned, discretely placed, raster scanned, adjusted, turned, etc., to capture one or more predefined surfaces, parts, objects, or areas within the processing tool. In one embodiment, the scope can be equipped with an optical source (e.g., via a fiber optic). The optical source can include an optical detector, which produces data processed by an optical processor. In one embodiment, the scope can also include an image source (e.g., a camera coupled via fiber optic), which produces data processed by an image processor. In some embodiments, the scope may include one of an optical camera, imaging camera, SIMs (Scanning Electron Microscopes), RGB cameras, infrared cameras, depth sensing cameras, or any other camera that can detect color or difference in reflections.

The scope can be, in one embodiment, remotely controlled through cables or via wireless signals by a positioning system. An isolation valve, in one embodiment, is used to enable the scope to enter the process tool while the plasma is off and wafers are being exchanged. As mentioned above, it is possible to obtain a wealth of information via the scope, and this information can be used to control chamber conditions to ensure minimum variability and maximum time between wet cleans or service.

In one embodiment, the scope is configured to emit light wave signals using an optical source, and collect reflections of surfaces using optical sensors. The optical sensors communicate the sensed information to an optical detector for processing by an optical processor. The optical processor is configured to analyze the reflected light intensity versus wavelength normalized to the incident radiation intensity and spectrum from an area of the surface onto which the light was focused. Using this information, one embodiment includes estimating film thickness and film composition of the particulate matter. In one embodiment, the wavelengths used can span the electromagnetic spectrum.

In one specific example, the wavelengths are ultraviolet infrared (UV-IR) wavelengths. It is believed that UV-IR wavelengths provide comprehensive information about film properties, such as chemical composition on chamber walls. With such data, it is possible to optimize when substrate processing should end before a next wet clean. Broadly speaking, the tool model is used to learn and forecast the behavior of a process recipe in terms of process performance as the physical characteristics of the chamber surfaces change due to particle matter build-up and consumable part wear. This information in turn, can be used to provide signals that correlate with process shifts and drifts. Such signals can then be used in a closed loop control scheme by adjusting recipe parameters to compensate for the impact of residue build-up on the walls that resulted in the corresponding process shift and/or drift. In this way, process windows can be expanded and times between cleans can be extended.

Besides spectral information in the light reflected from the chamber walls, images of each exposed region of the chamber can be collected and analyzed for uneven coating wear, residue build-up, uneven pre-coats, etc. As mentioned above, the scope can also include a camera that collects image data that is processed by an image processor. The image processor can collect images collected over multiple sessions of imaging, which can then be coalesced into a time-based history of changes in the build-up of residues and/or consumable part wear. In one configuration, by rotating while translating the light source and detector, parts of the chamber, specific areas, specific parts or the entire inside of the chamber can be image profiled. In one embodiment, such information can also be used to modify designs (e.g., geometries, materials, locations, sizes, etc.) to extend consumable part lifetimes.

In further embodiments, it is also possible to predict chamber failure and thereby trigger preventative maintenance with specific information about which part is failing. Such possibilities are realized by pattern defect detection, i.e. the original pictures are compared to subsequent pictures and if differences appear, alarms can be set or trends tracked.

When such imaging data is combined with the spectral data described above and other sensor and equipment monitoring data (for example, pressure control valve position, pressure, optical emission data, real-time reflectometer data from the wafer, reflected power, wall temperatures, wafer temperatures, etc., then multi-variate algorithms can be utilized or self-learning programs, such as neural networks. In one embodiment, the tool model is configured to be refined over time and/or trained to identify or recognize deviations from a process norm. A closed loop control algorithm can then be applied to adjust for changing chamber state and thereby reduce variability wafer-wafer, lot-lot, and chamber-chamber, increase time between wet cleans, and increase process window. These data can also be combined with fab-wide data from upstream and downstream tools and metrology stations to enhance the control capabilities of multi-variate process control.

It will be apparent, that the present embodiments may be practiced without some or all of these specific details. In other instances, well-known process operations have not been described in detail in order not to unnecessarily obscure the present embodiments.

FIG. 1 provides a block diagram in which a semiconductor tool 102, is part of a plasma processing system 100, in accordance with one embodiment. In this example, the semiconductor tool 102 is configured for processing substrates 104, which are introduced into the semiconductor tool 102 via robots that handle the delivery of substrates to and from the semiconductor tool 102. Typically, load locks and gate valves are used to enable transfers of substrates 104 into and out of the semiconductor tool 102, while still maintaining vacuum in the system. In various configurations, the semiconductor tool 102, is part of a cluster tool, which can include a vacuum transfer module. Vacuum transfer modules typically have various sides onto which semiconductor tools 102, can be attached.

The types of semiconductor tools 102 can vary, depending on the fabrication operation to be performed on substrates 104. By way of example, semiconductor tool 102 can be a plasma processing system, which may be utilized for etching operations. In other embodiments, the plasma processing system can be utilized for deposition operations. Commonly, depending upon the plasma process operation to be performed, the chamber configuration is optimized for that process. For instance, there are various types of etching chambers, which may be optimized for the type of material being etched.

Some etching chambers are optimized for etching metallic materials disposed on substrates, while other etching chambers are optimize for etching dielectric materials disposed on substrates. In either configuration, no matter whether the semiconductor tool 102 is an etching tool, a deposition tool, or other type of processing tool, the inside surfaces of the semiconductor tool 102 will experience build-up of particle residues, which will increment over time as the processing of more substrate 104 takes place. Additionally, certain structures within the semiconductor tool 102 will also experience wear and may need replacement periodically. These structures are typically referred to as consumable parts, which are oftentimes replaced at certain intervals. The intervals at which consumable parts are replaced can vary, but typically replacement will occur periodically based on expected lifetime of the consumable part and/or after physical inspection when the semiconductor tool 102 is opened for inspection or cleaning.

Continuing with FIG. 1, it is shown that semiconductor tool 102 is interfaced with process parameters/facilities 106. The facilities typically include, gas supplies used to supply etching gases, inert gases, deposition gases, vacuum, cooling fluids, temperature controls, power supplies, and other structural and mechanical systems. A controller 109 is typically part of the plasma processing system 100, which controls operations of the process parameters and facilities 106, and also interfaces with the semiconductor tool 102. The controller can communicate with other components of the plasma processing system 100, to ensure operational processes are carried out, e.g., in accordance with set processing recipes.

In one embodiment, the semiconductor tool 102 is configured with a scope 156, which can be inserted into the semiconductor tool 102 through an isolation valve 103. The scope 156 is connected to an arm 150 that can reach into the inside of the semiconductor tool 102 for inspection of surfaces within the semiconductor tool 102. The arm 150 can be configured with several mechanical joints, which will enable placement of the scope 156 in various angles and vantage points within the semiconductor tool 102. The scope 156 is coupled to a positioning system 107, which can drive the arm 150 into the semiconductor tool 102 via the isolation valve 103. The positioning system 107 can assist in rotating the scope 156, turning the scope 156, angling the scope 156, scanning the scope 156, raster scanning the scope 156, spot checking using the scope 156, and other positional functions. Also shown is a detector module 108, which is coupled to the scope 156 through the arm 150.

The detector module 108, as will be described below, is configured for one or more types of data gathering through the scope 156. The data gathering can include, for example, capturing spectral data that is reflected from surfaces and materials adhered to surfaces within the chamber of the semiconductor tool 102. In another embodiment, the data gathering can also include capturing image data of surfaces and structural features within the chamber of the semiconductor tool 102.

The processing of substrates 104 by semiconductor tool 102 can also be analyzed by one or more analysis tools, to produce process performance 105. By way of example, substrates that are processed by semiconductor tool 102 can be analyzed for performance in forming features with certain critical dimensions, e.g. as a result of an etch operation. Other performance analysis can include determining the uniformity of an etch operation. Other performance analysis can include determining deviations in etch rate across the surface of the substrate. Other performance analysis can include determining whether etching operations are achieving desired aspect ratios. Other performance analysis can include determining thicknesses of material layers after certain etch operations are performed. Other performance analysis can include determining whether etch depths for certain features have been achieved. Other performance analysis can include determining whether feature collapse has occurred. Other performance analysis can include comparing etch performance in the center of the wafer as compared to the edge of the wafer. Other performance analysis can include examining features proximate to the edge exclusion region of a wafer.

If the semiconductor tool 102 is a deposition tool, other types of performance analysis can be performed to characterize the efficiency of the deposition operations. As will be understood by those skilled in the art, process performance can be categorized in many ways, and can be categorized based on expected results. The above list of performance analysis characteristics and analysis results are only by way of example, as many more different types of performance analysis metrics can be defined, and can be customized to specific recipes or desired results.

Still referring to FIG. 1, the results obtained by the detector module 108 after inspection of the semiconductor tool 102, along with process performance 105 achieved by semiconductor tool 102, can be transferred to a tool model processor. The tool model processor 112, is configured to track the process performance 105 against the characteristics that are physically detected within the surfaces of the semiconductor tool 102 by the detector module 108. For example, the detector module 108 may produce characterizing data associated with physical structures within the semiconductor tool 102, and the associated buildup of particulate matter and residues on such structures.

In one embodiment, as more substrates 104 are processed by the semiconductor tool 102, the detector module 108 can examine, for example, after processing of a specific substrate 104. As mentioned above, the inspection using the scope 156 can occur after a substrate 104 is processed, e.g., during a wafer transfer operation, and before the next substrate is introduced into the semiconductor tool 102.

In one embodiment, the detector module 108 can examine the semiconductor tool 102 after each substrate 104 is processed. In another embodiment, the detector module 108 can examine the semiconductor tool 102 after a number of substrates 104 are processed. In still another embodiment, the detector module 108 can examine the semiconductor tool 102 after a lot of wafers is processed. Still further, the detector module 108 can alternatively examine the semiconductor tool 102 after a predefined number of lots or wafers are processed.

In some embodiments, the semiconductor tool 102 can be examined by the detector module 108 on demand. For example, if an operator detects a shift or drift in the process performance 105, the operator can instruct the detector module 108 to perform an examination of the semiconductor tool 102, without bringing the semiconductor tool 102 down from vacuum.

Continuing with the processing performed by the tool model processor 112, the tool model processor is configured to associate processed performance parameters and metrics to specific conditions within the semiconductor tool 102. For example, it is common for a liner to be present in an etching tool, and such liner is known to receive buildup of etch byproducts and residues. As the buildup of etch byproducts and residues occurs, it is possible to identify and correlate the changes in process performance 105.

The tool model processor 112 can, in one embodiment, associate the process performance 105 at a more granular level, such as associating the performance of the semiconductor tool 102 in terms of the process parameters used. For instance, an etch recipe can be associated with specific process parameters, such as RF power, bias power, gas pressure, temperature, flow rates of etchant gases, flow rates of inert gases, etc. Each of these types of parameters are associated to specific etch recipes. In one embodiment, it is possible to track the process performance 105 with association and correlation to the parameters of the etch recipes. By way of example, as the buildup of polymers, particulates, and other materials occur on surfaces of the chamber parts, it is possible to detect a process drift or shift. The tool model processor 112, over time, will categorize and correlate the changes in the surfaces within the semiconductor tool 102 to the resulting process performance 105.

A tool model is therefore generated for the semiconductor tool 102 by the tool model processor 112. The tool model is configured to have information that would predict future processing changes in the process performance 105 by the semiconductor tool 102, given certain conditions detected by detector module 108. In one embodiment, the correlation between detected conditions within the semiconductor tool 102 and the process performance 105 will continue as more and more wafers are processed. By continuing to perform this correlation, it is possible that the tool model will be refined to provide more accurate representation of what occurs or what impacts the process performance 105 for specific process recipes, as the conditions of parts, surfaces, and materials within the semiconductor tool 102 are detected.

A process drift analyzer 114 can be utilized to receive information from the tool model processor 112, which would be able to identify when process drift has occurred in the process performance 105, and associate that process drift to specific conditions within the semiconductor tool 102. In one embodiment, a parameter adjustment module 116 is used to identify specific parameters of a process recipe, which may be adjusted in order to offset the detected process drift. The parameter adjustment module 116 can identify, for example, a need to increase the pressure of the chamber in order to offset the detected drift in the process performance 105.

The controller 109, being in communication with process parameters/facilities 106, and the semiconductor tool 102, can provide for adjustments to the pressure supplied to the semiconductor tool 102. This control back to the controller 109 is considered a closed loop control 110. Closed loop control 110 is therefore configured to continuously monitor or receive information from detector module 108, and the process performance 105. The tool model handled by the tool model processor 112, will therefore be used to identify process drift by the process drift analyzer 114 that then identifies using parameter adjustment module 116, a specific parameter to adjust, to compensate for the drift in the process performance 105. In some embodiments, when the tool model has been refined after processing many substrates 104, the tool model itself can be used to correlate and detect the changes in the surfaces of the semiconductor tool 102 as provided by detector module 108, and identify a parameter to perform the adjustment, before even analyzing the process performance 105.

In one embodiment, the process performance 105 can be identified over a period of time, to enable the construction of the tool model. Once the tool model has been constructed, and is considered to be stable, the system will only require the detector module 108 to examine the interior surfaces of the semiconductor tool 102, to then identify and predict what the process performance 105 will be. The process drift analyzer 114, can simply identify the process drift that is anticipated from the tool model handled by the tool model processor 112, and can identify the parameter or multiple parameters that should be adjusted by the parameter adjustment module 116. Accordingly, it should be understood that the tool model, once constructed, can be utilized in conjunction with the detector module 108, to predict changes in the process performance, and provide the closed loop control 110 for making adjustments to one or more parameters for specific recipes.

In some embodiments, the tool model can be constructed using a plurality of test substrates, which can be analyzed to identify process performance 105. The process performance 105 will then be correlated to the detected conditions of the interior portions of the semiconductor tool 102. By running these test substrates 104, it is possible to construct a tool model for the semiconductor tool 102, for specific recipes. By way of example, the tool model can be configured to include characterizing information that is specific to certain process recipes. If a new process recipe needs to be characterized into the tool model, substrates can be used to calibrate the tool model to include information for that new recipe. In other embodiments, a separate tool model can be constructed for each specific recipe. It should be understood that the tool model can be constructed in situ, while processing actual production substrates for a specific recipe. The tool model can also be constructed before actual production substrates are processed, e.g., using test or calibration substrates. In either configuration, the tool model that results can be used to predict performance of the process as the changes occur to the inside surfaces of the semiconductor tool 102. The detector module 108 can therefore provide this inspection periodically, on demand, or even after each substrate is processed. The information gathered by the detector module 108 can therefore be compared or correlated to the tool model to produce a predicted process performance 105, and to identify a parameter adjustment, if necessary.

As an advantage, processing using the tool model for semiconductor tool 102, and the detector module 108, can assist in prolonging the period of time between wet clean operations of the semiconductor tool 102. For instance, in the past, when a process drift was detected, the system would simply be shut down for cleaning or inspection. Sometimes, the system would be programmatically shut down for cleaning or inspection, which may be premature and would cause shortening of the wet clean cycles. By being able to detect the conditions of the surfaces within the semiconductor tool 102 without breaking vacuum, it is possible to identify the conditions and make adjustments to parameters of the process recipe that would compensate for a predicted drift in the process performance. The result is that processing by the semiconductor tool 102 can occur for more wafers before a wet clean cycle needs to be initiated. Additionally, the detector module 108, using scope 156, can also aid in preventing unnecessary shutdowns of the system when operators experience a drift in process, or suspect consumable part wear. As a result, the embodiments of the present invention also assist in confirming with real-time data that consumable parts are operating properly or in fact need replacement (i.e., preventing false positives).

Figure 2:
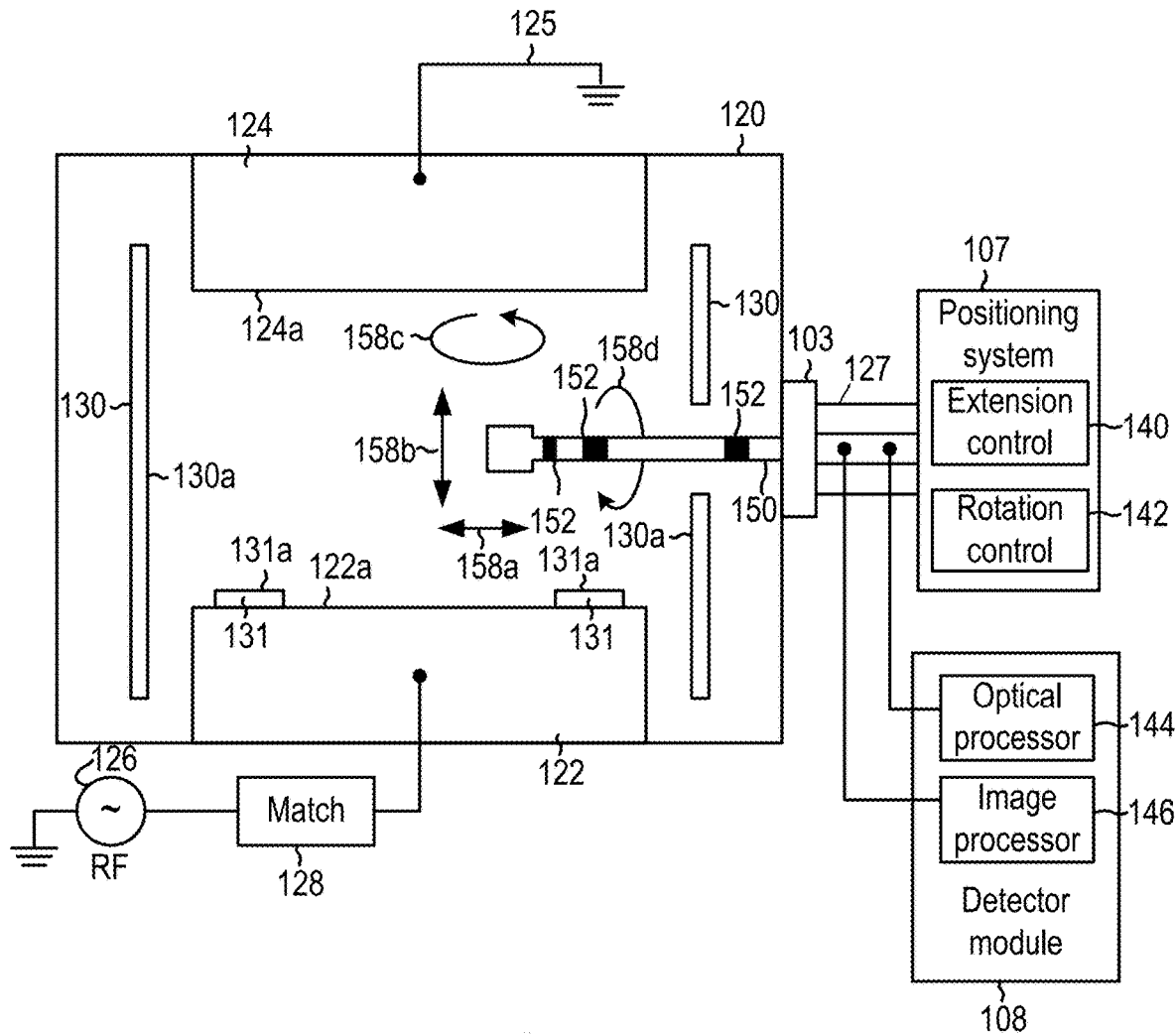
FIG. 2 illustrates an exemplary diagram of a chamber that defines part of the semiconductor tool, in one embodiment.

FIG. 2 illustrates an exemplary diagram of a chamber 120 that defines part of the semiconductor tool 102, in one embodiment. As shown, chamber 120 includes a lower electrode 122, and upper electrode 124, radio frequency (RF) power source 126, a match 128, and ground 125 connected to the upper electrode 124. Further shown for purposes of example, is a liner 130, which surrounds an interior surface of the chamber walls of chamber 120. A focus ring 131 is also shown disposed over the lower electrode 122. A substrate (not shown) is configured to sit over a surface 122*a* of the lower electrode 122, and surrounded by the focus ring 131. The chamber 120, in this example is a capacitively coupled plasma (CCP) chamber. The type of chamber is only by way of example, and other types of etching chambers, e.g., inductively coupled plasma (ICP) chambers may also benefit from embodiments described herein. Depending on the type of chamber, the interior surfaces, parts, and components will vary. For this reason, it should be understood that the example surfaces within the chamber 120 are only by way of example, and the scope 156 can be used to examine any surface within an interior area of a chamber, whether it be for etching, deposition, inspections, or other processing functions.

With this in mind, example surfaces 124*a* of the upper electrode 124 will be exposed to the plasma when generated, which can also receive and generate material particulates and/or etch residues. Surface 130*a* of the liner 130, surface 131*a* of the focus ring 131, and the surface 122*a* of the lower electrode 122 will similarly be subjected to at least some of the material particulates and/or etch residues. The scope 156, in one embodiment, is introduced into the inside of the chamber 120 by way of an isolation valve 103. Isolation valve 103 ensures that the vacuum within the chamber 120 will remain, and therefore inspection can occur without opening the chamber 120. In one embodiment, the scope 156 can be extended and retracted through the isolation valve 103. The arm 150 can include a number of mechanical joints 152, which will enable the scope 156 to move within the chamber 120 in various directions, angles, rotational perspectives, and/or positions. For purposes of illustration, the scope 156 can be inserted and retracted in direction 158*a*, can be raised vertically and lowered vertically in direction 158*b*, can be rotated along a horizontal axis in direction 158*c*, can be rotated along a vertical axis in direction 158*d*.

Positioning system 107 is therefore shown to include extension control 140 and rotation control 142. These controls can be used to move and maneuver the scope 156 in the desired positions. In one embodiment, the positioning system 107 can be configured to scan the interior of the chamber in particular patterns. The patterns can be programmatically defined so that the scanning and positioning of the scope 156 captures information from specific areas, parts, locations, zones, etc.

Detector module 108, in one embodiment, includes an optical processor 144 that is coupled through a conduit 127, through the arm 150, and to the scope 156. The optical processor 144, in one embodiment, is configured to control the delivery of light waves to the scope 156, for projection onto a desired surface to be inspected. The light waves are configured for transmission onto the desired surface, and reflected. The reflected light spectra is then captured by sensors and communicated back to the optical processor 144. As mentioned above, the light waves are preferably communicated in the ultraviolet infrared spectrum, which when reflected off of a surface and materials present on the surface, will produce information that can be categorized and associated to the type of material being detected. In another embodiment, the detector module 108 can also include an image processor 146, which also communicates through conduit 127, arm 150, and to the scope 156. In this embodiment, image data from a camera disposed on the scope 156 can be used to capture image data of the surfaces being examined. The image data can be used, as mentioned above, to compare changes in the surfaces from prior captures of image data. The comparison can therefore identify when changes in the material buildup have occurred, or when certain residues have occurred in a form that could produce excessive particle generation. For instance, the image data can identify when certain residues are not adhering properly, and are more susceptible to flaking and thus causing more particle generation. Thus, by using a combination of optical processor 144 for an image processor 146, it is possible to characterize the materials and surfaces within the chamber 120, and identify conditions that would be indicative of a need for cleaning, service, or consumable part replacement.

Figure 3:
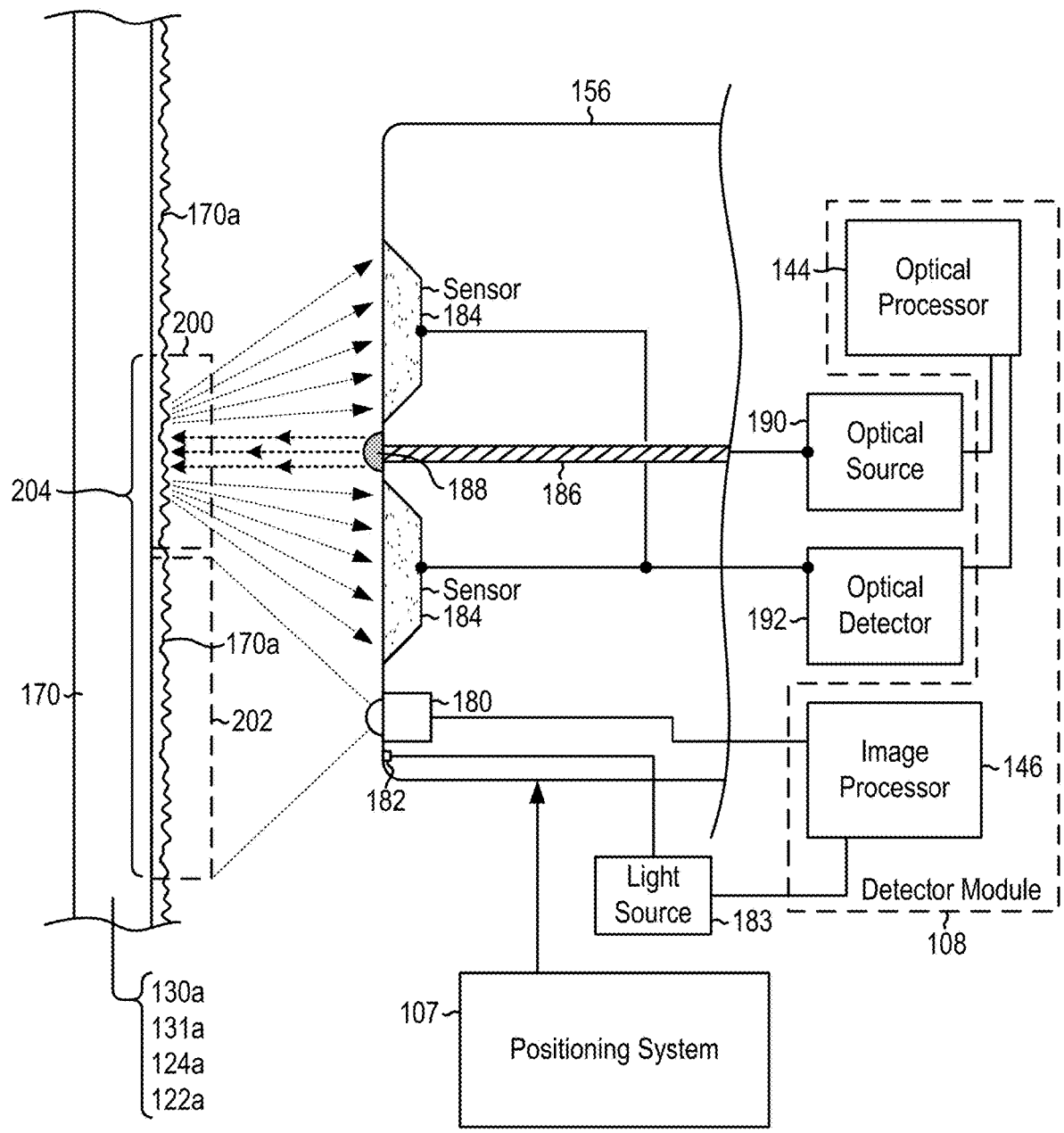
FIG. 3 illustrates an example chamber part, having material particles and/or polymer residues built up as a result of processing operations by the chamber.

FIG. 3 illustrates an example chamber part 170, having material particles and/or polymer residues built up as a result of processing operations by the chamber 120. In one embodiment, the scope 156 can be configured for placement in a location that will examine a specific portion, region, part, or area of the inside of the chamber 120. In this example, the scope 156 has been directed toward the surface 170a of the chamber part 170. In one configuration, the scope 156 can have a face that can be directed toward the surface 170a. In one embodiment, the scope 156 is placed at a distance sufficient to allow admission of light waves toward the surface 170a and collection of reflected data by sensors 184 of the scope 156. By way of example, the face of the scope 156 can be placed at a distance that ranges between 1 cm and 50 cm, and preferably between 2 cm and 20 cm.

The scope 156, in one embodiment, includes a fiber optic line 186, which terminates at the front face surface of the scope 156. In one embodiment, a lens or other focusing mechanism 188 may be used to direct the light propagated through the fiber-optic line 186 out of the front face of the scope 156. In one embodiment, the wavelengths of the light directed toward the surface 170a, can be directionally focused perpendicular from the front face of the scope 156. In another embodiment, the light can be focused at specific angles relative to the front face of the scope 156. In either configuration, the light is focused onto an area 200, of the surface 170a. As illustrated, light reflected off of surface 170a is caused to disperse and generate wavelengths that can span the electromagnetic spectrum, optimally in the UV-IR wavelength range, as this range of wavelengths would provide the most information about film properties and/or chemical composition on the surface 170a. As shown, the scope 156 will preferably include one or more sensors 184, which are configured to capture the reflected wavelengths of light emanating from surface 170a, which may have particulate matter and/or etch residues accumulated thereon.

In one embodiment, if the particulate matter and/or etch residues have a coarse or porous structure; the surface texture will act to produce a dispersion of the applied light, which is then collected by sensors 184. Data collected by sensors 184 can then be communicated to optical detector 192 for processing by optical processor 144. In one embodiment, the scope 156 can also include a camera 180, which is configured to capture image data of surface 170a. In still another embodiment, scope 156 can include an LED light 182, which may be used to illuminate the area that is being imaged by camera 180. The LED light 182, can be controlled by a light source 183 and image processor 146.

Image processor 146 can control activation of the camera 180, and can retrieve the image data for processing by the detector module 108. As shown, positioning system 107 is configured to move scope 156 in various locations within the chamber 120, to gather information regarding the condition of surfaces, parts, consumable part wear, and other identifiable metrics. Although the scope 156 has been shown to include capabilities for capturing optical data and image data, it is possible to configure scope 156 to only capture optical data or only capture image data, or both. Additionally, the placement and geometry of the emitter of light provided by fiber-optic line 186, the sensors 184, the camera 180, the LED light 182, and the shape of the scope 156 can be modified, depending on the desired structural configuration.

Figure 4A:
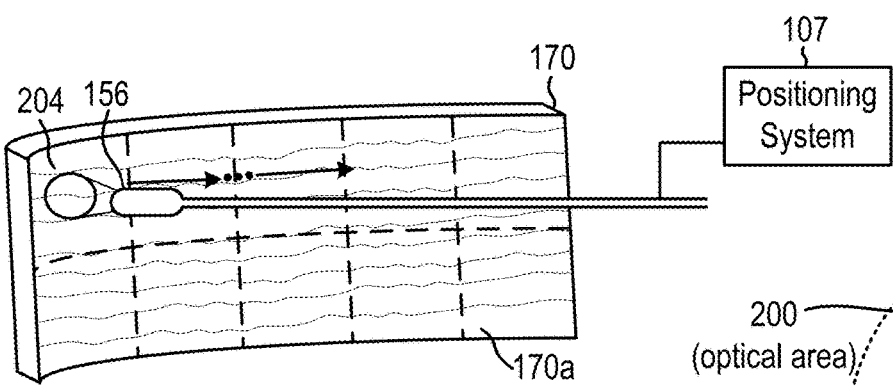
FIGS. 4A-4D illustrate embodiments where a positioning system is configured to move a scope to capture surface data of chamber parts.
Figure 4B:
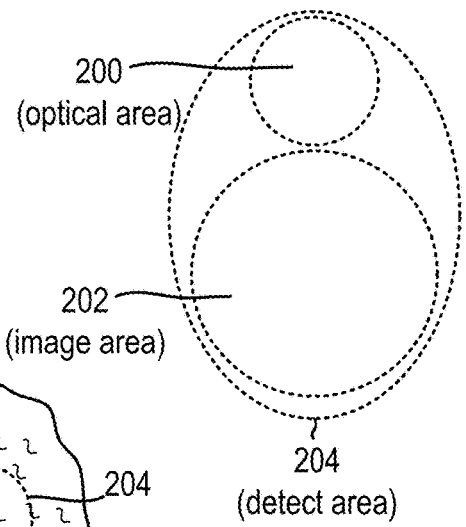

FIG. 4A illustrates an embodiment where positioning system 107 is configured to move scope 156 to capture data of chamber part 170, in accordance with one embodiment. In this illustration, it is shown that the scope 156 can be positioned by position system 107 at various locations, sections, areas, parts, etc. of the chamber part 170. For example, different areas of the chamber part 170 can be predefined for inspection of a detection area 204. By way of example, in order to collect accurate data associated with accumulation of particulate material and/or residues, the scope 156 can be programmed to collect data from the same location on subsequent inspections. This way, the same location can be tracked for changes as more substrates are processed. In another embodiment, the scope 156 can be scanned horizontally or moved position-wise to capture information from other detect areas 204, which can be predefined or programmed for re-inspection to maintain accurate timewise data of specific material buildups. FIG. 4B illustrates how scope 156 may be configured to have a detected area tool for, which can include an image area 202 from which image data is collected using camera 180, and optical area 200 from which optical data is collected. In another embodiment, the optical area 200 can be contained within the image area 202. For example, the optical area 200 can be centered within the image area 202. This can be achieved by directing the optical area 200 to an area being captured by the camera 180.

Figure 4C:
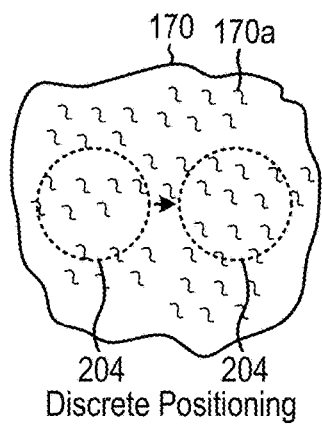
Figure 4D:
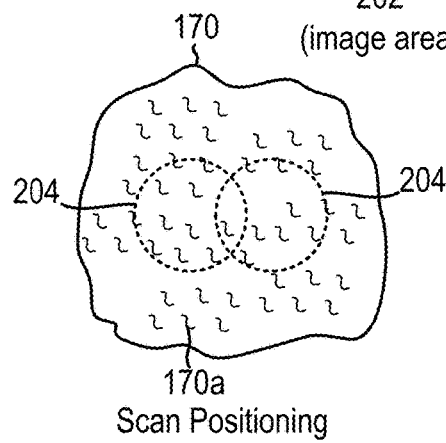

FIG. 4C illustrates an example where detect area 204 is selected for discrete positions over the surface 170a of the chamber part 170. For example, programming can be provided so that the scope 156 is moved from one position and then to the next position. FIG. 4D illustrates an example where the scope 156 is continuously on, and can be scanned from position to position to have overlapping detecting areas 204. It should be understood that the locations and manner in which the data is collected can vary, so long as the same areas can be re-inspected, so that the tool model can be accurately constructed as more and more substrates are processed, or after a number of substrates are processed during a training or calibration operation.

Figure 5:
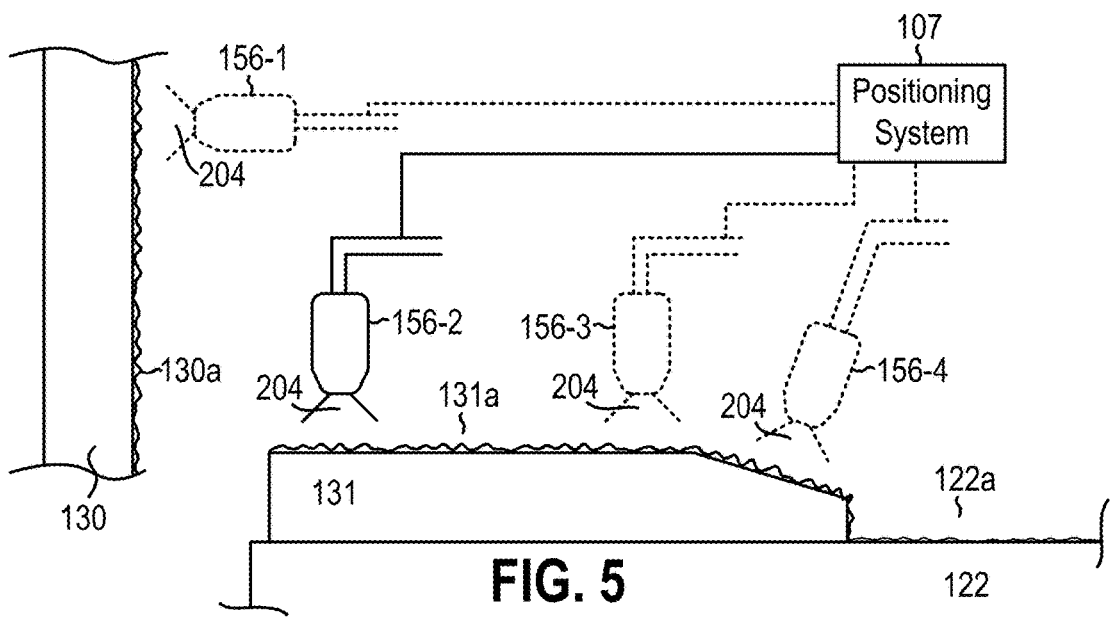
FIG. 5 illustrates an example of positioning system moving a scope to various locations within the chamber, in accordance with some embodiments.

FIG. 5 illustrates an example of positioning system 107 moving the scope 156 to various locations within the chamber 120. As shown, scope 156-1 can be positioned to scan a detect area 204 of the liner 130, to capture the surface 130a of the liner 130. Scope 156-2 can then be positioned to capture the surface 131a a focus ring 131 near an outer periphery. Programming can then be set to capture the surface 131a near a top inner circumference of the focus ring 131, when the scope 156-3 is moved by position system 107. The scope 156-4 can then be moved at an angle, so that the surface of the focus ring near the sloped portion can be imaged by detect area 204. This example has been provided to show that the various mechanical joints of the arm 150 can be programmable to be moved to place the scope 156 in different programmable locations within the chamber, so as to capture the condition and/or progression of material buildup during processing of substrates.

Figure 6:
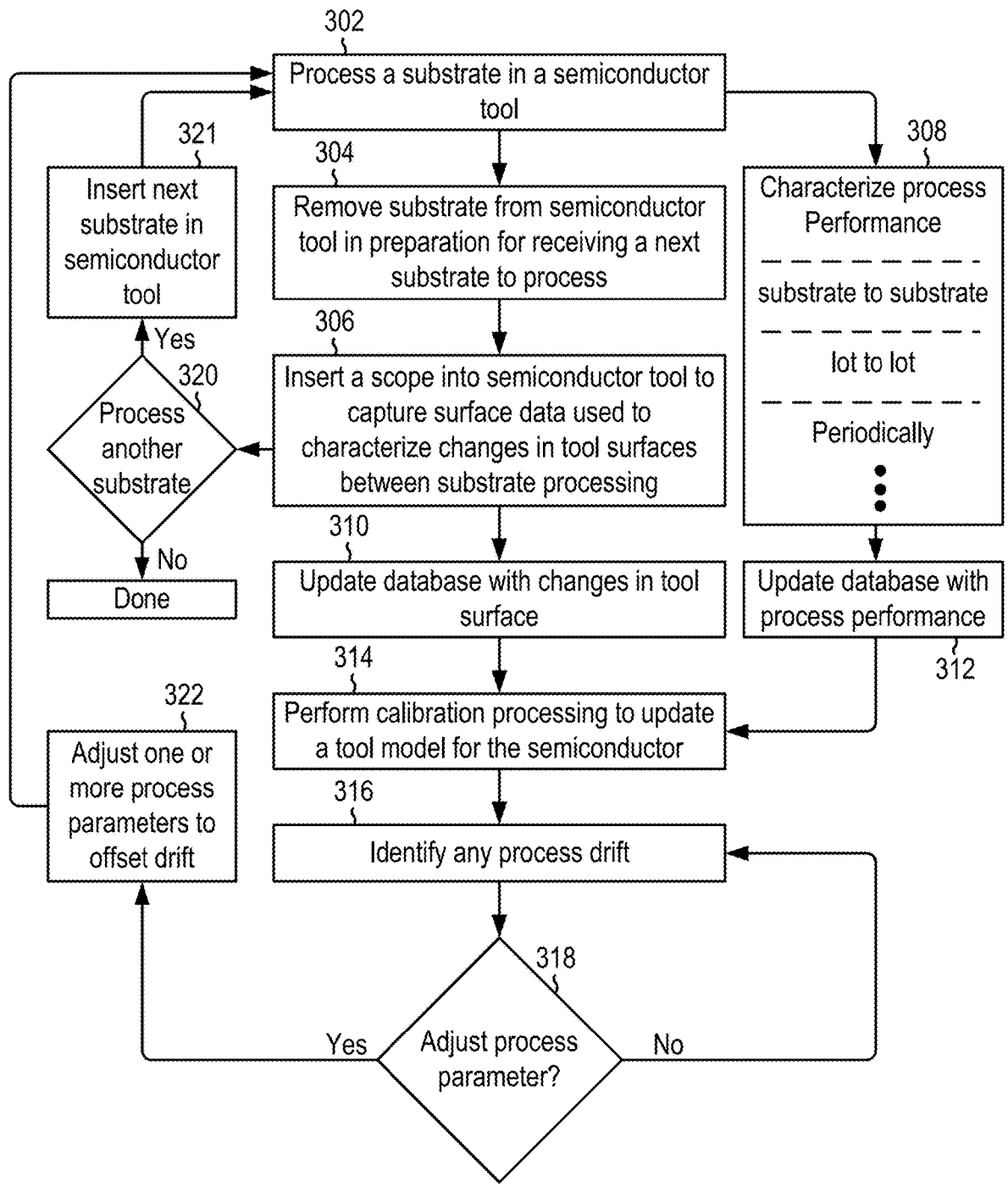
FIG. 6 illustrates a flowchart diagram of process operations that can be performed to construct and use a tool model, in accordance with some embodiments.

FIG. 6 illustrates a flowchart diagram of process operations that can be performed, to construct a tool model, and utilize a tool model to predict maintenance operations required for a semiconductor tool and/or make adjustments to parameters of a process recipe, to productively optimize and/or extend the functionality of the tool in between clean cycles. In one example embodiment, the substrate is processed in a semiconductor tool in operation 302. Once the processing of the operations is complete, e.g., the etch operation has been performed, the method moves to operation 304 where the substrate is removed from the semiconductor tool in preparation for receiving a next substrate to process.

In one embodiment, after the processing of the substrate, it is possible to characterize the process performance in operation 308. The characterization of the process performance can be performed after each substrate is processed, after a lot of substrates are processed, periodically, or on demand. In one embodiment, characterization of the process performance in operation 308 can be performed as an initial calibration of the semiconductor tool, where a number of substrates are processed in order to build a tool model for the semiconductor tool.

Once the tool model has been built, and its function is satisfactorily predicting process performance based on detected physical characteristics examined within the chamber, then substrates will not require characterization in operation 308 after each substrate is processed. In operation 306, a scope is inserted into the semiconductor tool to capture surface data used to characterize changes in the tool surfaces between substrate processing.

As mentioned above, the scope can be inserted into the semiconductor tool without bringing down vacuum, so that processing utilizing the semiconductor tool can continue to process more wafers. Specifically, the inspection utilizing the scope can occur without having to open the semiconductor tool, which can cause significant delays in re-calibrating and bringing the tool back into vacuum and operational state. In operation 310, a database is updated with the changes in the tool surfaces. The changes in the tool surfaces can include, for example, a type of material buildup, an amount of material buildup, the texture of the buildup, whether material is flaky or adhering consistently, and other characteristics.

As mentioned above, the changes in tool surfaces can be identified using optical analysis and also optionally image analysis. Operation 312 shows that data regarding the process performance can also be updated to the database. Information that was recorded during the capture of the process performance in operation 308 and the inspection utilizing the scope can then be added to a tool model for the semiconductor tool in operation 314. The tool model is generated by performing a calibration process that correlates information obtained regarding the changes in tool surfaces with the characterized process performance. The tool model will therefore have a correlation that can be used to predict process performance based on detected characterizations of the physical tool surfaces.

Over time, during the processing of more substrates or when a plurality of substrates are processed to generate the tool model during a training or calibration operation, the tool model will continue to shape its correlation data, until the tool model is accurately predicting process performance based on the detected changes in surface characteristics, as analyzed by the scope 156. In operation 316, a processor can be used to identify if any drift is occurring in the process performance, or if the model is predicting a drift in the process performance based on the detected characteristics of the tool surfaces or surface. In operation 318, it is determined if a process parameter should be adjusted based on the identified drift or predicted drift. If no adjustment is determined to be required, the method will return to operation 316. If it is determined that a particular parameter or parameters should be adjusted, the method moves to operation 322 where one or more process parameters are adjusted in order to offset the detected drift or predicted drift based on the tool model.

At this point, the method returns to operation 302, where a next substrate can be processed utilizing the adjusted parameters. The adjusted parameters, as mentioned above, can vary depending on the process recipe. The parameters can include adjusting pressure, adjusting temperature, adjusting power levels, adjusting bias voltages, adjusting distances between the upper and lower electrode, adjusting frequencies, and or adjusting one or more parameters. In one embodiment, the parameters that are identified for adjusting can be selected based on known effects, which can counteract specific drifts in process performance. This information can be stored in memory accessible by a controller, so that the appropriate parameter or parameters can be adjusted. As shown, after the scope is inserted into the semiconductor tool in operation 306, it is determined if another substrate should be processed. If another substrate should be processed, the next substrate is inserted into the tool in operation 321. If the adjustment in operation 322 was set before the next substrate should be processed, then the next substrate would be processed utilizing the adjusted parameters for the recipe.

Figure 7B:
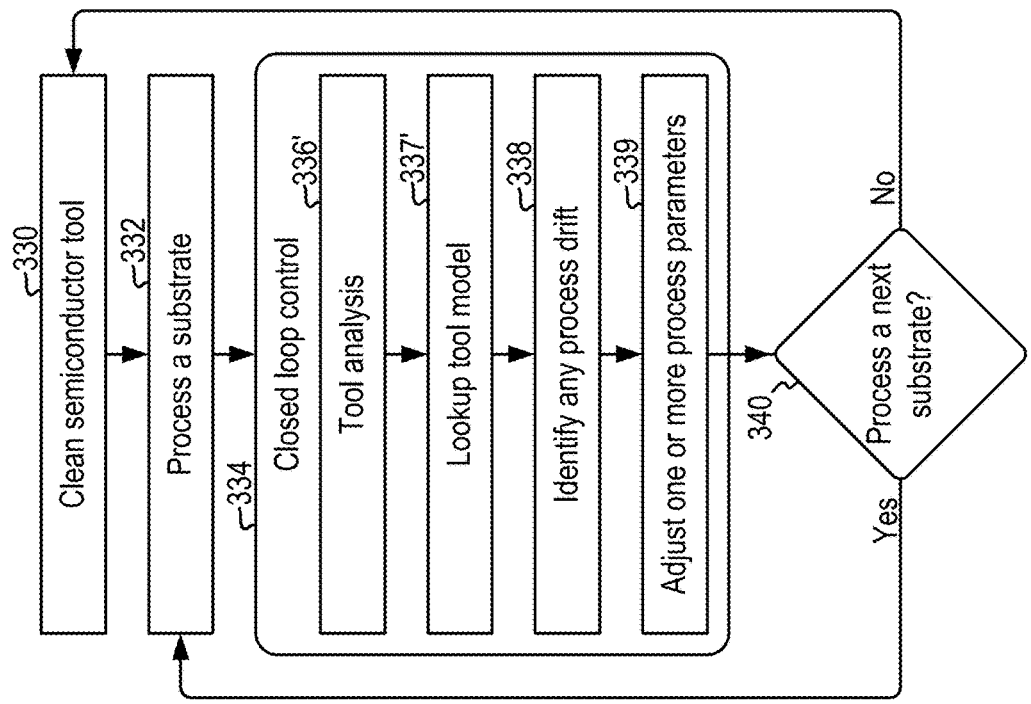
FIGS. 7A-7B illustrate examples of a closed loop control utilized during processing of substrates between clean operations, in accordance with one embodiment.
Figure 7A:
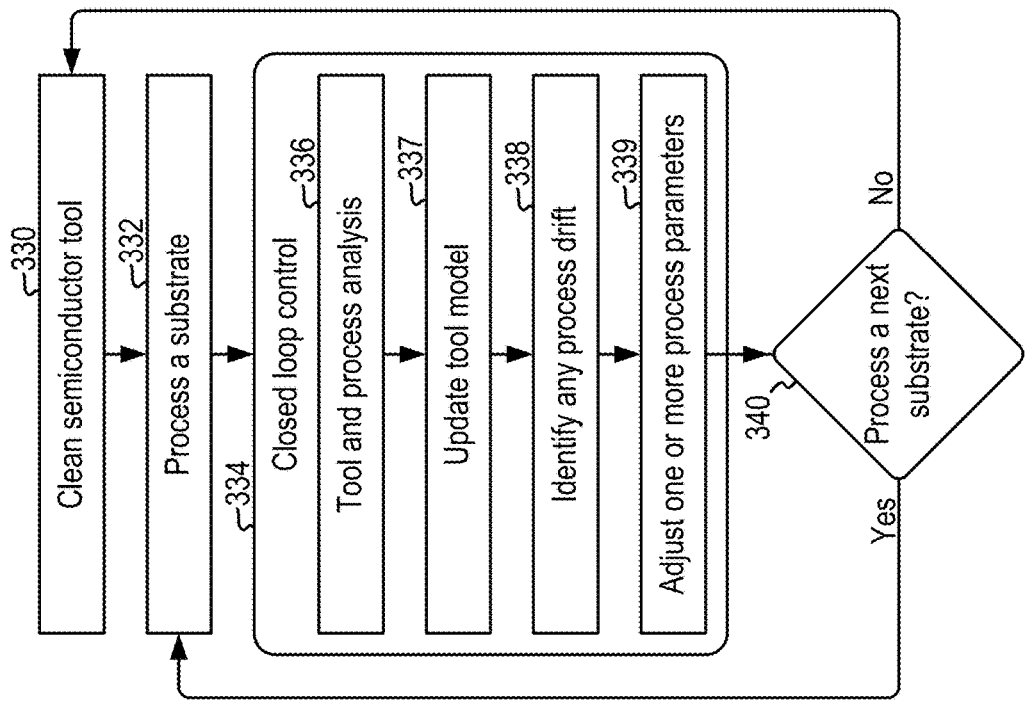

FIG. 7A illustrates an example of the closed loop control utilized during processing of substrates between clean operations, in accordance with one embodiment. In operation 330, the semiconductor tool is cleaned. The clean operation typically requires that the semiconductor tool be opened, and subjected to a wet clean. The wet clean operation may include removal of parts from within the chamber, in order to remove the particulate buildup and/or residues. In other embodiments, when the tool is opened, the tool may also be checked for wear of consumable parts. If consumable parts require replacement, they are replaced at this time. As mentioned above, it is desired that the time between wet clean operations be extended as much as possible, in order to process more substrates. However, it is also desired that the operation of the semiconductor tool is optimal during the entire period between wet clean cycles.

By providing the closed loop control 334, it is possible to dynamically adjust process parameters to compensate for any drift in process. Thus, in operation 332, a substrate is processed. After the substrate is processed, or after a plurality of substrates are processed, closed loop control 334 can be performed. Closed loop control 334 can include tool and process analysis 336. If tool and process analysis 336 are performed, then the tool model can be updated in operation 337.

In another embodiment, it is possible to simply perform tool analysis, using the scope 156. The information gathered from the tool analysis, can then be compared against the tool model for the semiconductor tool, which can identify a predicted drift in process. The drift in process can be identified for any process parameter in operation 338, with reference to the tool model.

In operation 339, one or more of the process parameters can be adjusted, to compensate for the identified process drift. In operation 340, it is determined whether a next substrate should be processed. It is possible that multiple substrates have been processed, and closed loop control 334 was processed after each substrate was processed. As mentioned above, it is also possible to operate closed loop control 334 only after a set number of wafers have been processed.

If it is determined that a next substrate should be process, the method returns to process a substrate in operation 332. If it is determined that a next substrate should not be processed in operation 340, the method returns to operation 330, where a wet clean is performed on the semiconductor tool. This might occur if it is determined that no further adjustments to the process should be made, and it is recommended that the tool enter the wet clean process.

FIG. 7B illustrates another embodiment, where tool analysis 336' is performed, followed by a look up to a tool model 337'. In this embodiment, the closed loop control 334 is configured to omit analysis of the process, and simply uses a tool model that has been calibrated. The tool model is thus looked up to identify if any process drift is predicted to have occurred based on the information present in the tool model. In operation, closed loop control 334 can be processed after each wafer is processed or after a set number of wafers are processed, or anytime a system process or program determines that loop control should be performed. For instance, a program setting may be provided to perform loop control after certain number of hours of operation has passed, or when one or more other sensor data indicates a need to perform closed loop control 334.

When closed loop control 334 is processed, the system can use detector module 108 to inspect one or more areas within the process module, and based on the detected data/information, that information can be used to index to the tool model. The tool model will then produce information, e.g., information that is indicative of expected performance of the semiconductor tool. Active adjustment of one or more process parameters can then be executed, to optimize active on-going processing and/or make adjustments to compensate for any anticipated or actual drift or shift in process performance.

Figure 8:
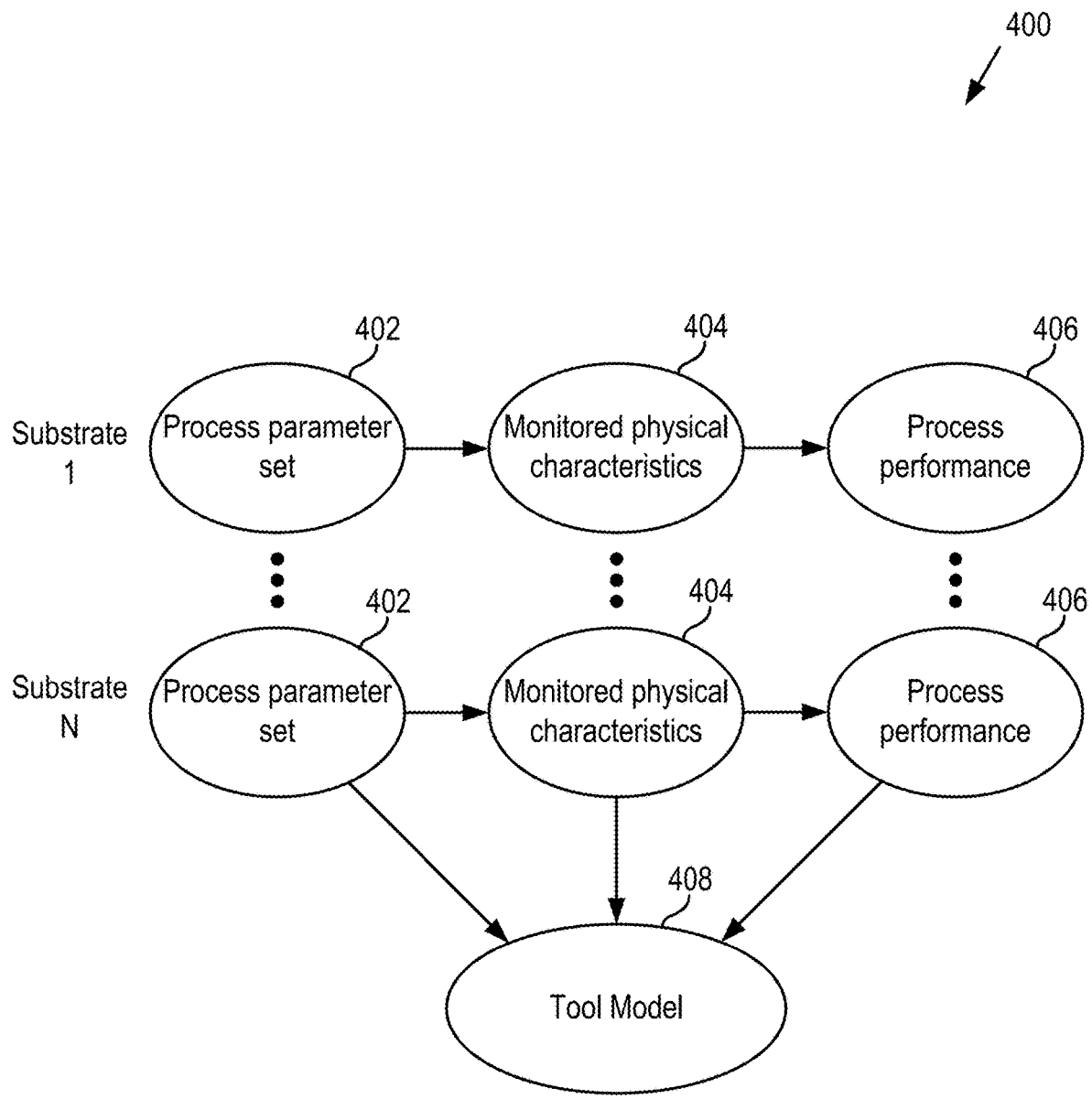
FIG. 8 illustrates a flow diagram of operations that may be used to construct or refine a tool model, in accordance with one embodiment.

FIG. 8 illustrates a flow diagram 400, showing how tool model 408 can be constructed. The construction of tool model 408, as mentioned above, can be generated over time, as substrates (1-N) are processed in the semiconductor tool. For example, the substrate can be processed with a specific recipe, which defines process parameter set 402. The process parameter set 402 can include, for example, the types of gases to be used, the flow rates, the temperature, the power settings, the structural settings of the chamber, and point detection processes, pressure settings, etc. In operation 404, the physical characteristics of the interior surfaces of the chamber are monitored. In one embodiment, the physical characteristics can be monitored for one or more areas within the chamber.

The areas to be monitored can be predefined, based on unknown areas of material buildup or polymer accumulation. In addition, process performance 406 can also be monitored from the substrate, by analyzing how well the process is performed. Various analytic tools can be used to measure performance, such as etch performance, uniformity performance, deposition performance, and other performance attributes. Thus, for the specific recipe and parameter set 402, the monitored physical characteristics in operation 404 are correlated to the process performance 406 and then added to the tool model 408. This process can be repeated for many substrates, and each time the information is added to the tool model 408, which causes a refinement and more accurate estimation of the correlations between monitored surface characteristics within the chamber and the process performance.

As mentioned above, building the tool model 408 can occur either during the life of processing of substrates, utilizing metrology information for assessing the process performance 406 of several substrates, or can occur during a tool model generation step. By way of example, it is possible to generate a tool model for a semiconductor tool for a specific recipe. The tool model can also be generated to model data for multiple recipes. The generation of the tool model can therefore occur off-line when non-production wafers are being processed. In either configuration, the tool model 408 is constructed over time, and refined as more inspections are correlated to process performance.

Figure 9:
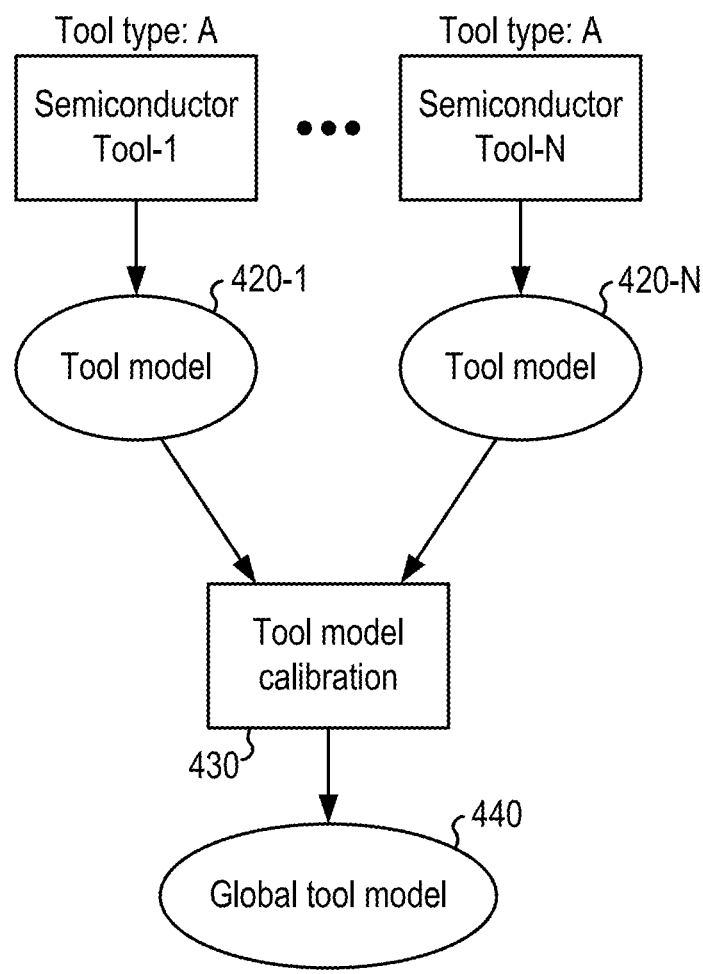
FIG. 9 illustrates an example of generating a global tool model, for a specific recipe, in accordance with one embodiment.

FIG. 9 illustrates an example of generating a global tool model 440, for a specific recipe. In some fabrication facilities, the same fabrication tool is installed in several ways or in the same cluster architecture. Commonly, the semiconductor tool is used to perform the same etch operation, to increase throughput. In one embodiment, the semiconductor tool can be of a same type, e.g. type A, and can be installed as tool-1 to tool-N. Each one of the semiconductor tools can generate a tool model 420-1, 420-N. If the modeling is for the same recipe, the information generated from each tool model 420 can be communicated to a tool model calibration unit 430. The tool model calibration unit 430 is configured to synthesize the detected performance and measured characteristics of the semiconductor tools, to improve the tool model.

This processing can accelerate the generation of a tool model that includes more data points, due to the multiple chambers being modeled for the same recipe. A global tool model 440, can therefore be established for a semiconductor tool of type A. Thus, if a new semiconductor tool of type A is brought online to process the same recipe for which a global tool model 440 was generated, predicted process performance can be instantly generated from the global tool model 440, so as to produce accurate and rapid closed loop control for adjusting parameters of the recipe on the newly installed semiconductor tool. These adjustments to the parameters are made, after the physical inspection is performed utilizing the scope 156, which gathered information by the detector module 108. The information gathered by the detector module 108 is therefore fed into the global tool model 440, which then provides for prediction of process performance and suggestions and/or active settings of adjustments to one or more process parameters.

Figure 10:
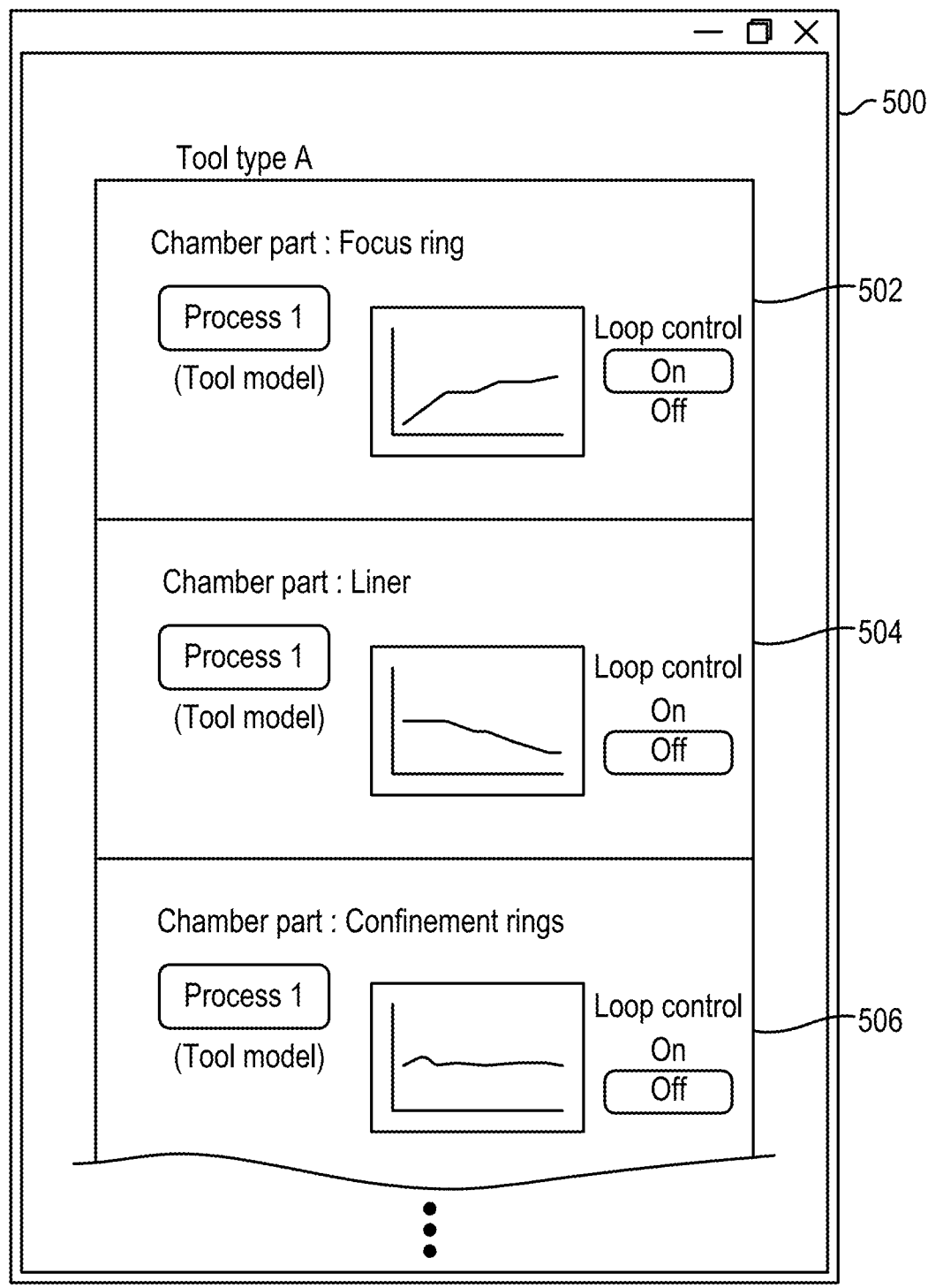
FIG. 10 illustrates an example of a user interface, which may be produced by controller or computer interfaced with a plasma processing system, in accordance with one embodiment.

FIG. 10 illustrates an example of a user interface 500, which may be produced by controller 109 of the plasma processing system 100. The user interface 500, can provide information regarding process performance by a specific semiconductor tool. In this example, the semiconductor tool is identified as Tool Type A. In this example, it is shown that process 1, is the recipe being executed by the semiconductor tool. One embodiment would provide information related to specific parts of the semiconductor tool.

This is illustrated by different screens or data provided by chamber parts 502, 504, and 506. For example, chamber part 502 is a focus ring, and the tool model has shown that the focus ring has been monitored using the scope 156, and the tool model is predicting that process performance will have a shift as more substrates are processed. Also shown is that loop control is on, meaning that the system will automatically use the tool model to identify one or more recipe parameters to adjust, to compensate for the predicted drift produced by the changes in the focus ring surface. Chamber part 504 is for a liner, and this also shows that loop control is off. This means that the system has been calibrated to not compensate for changes in material buildup in the liner.

If the operator decides that loop control should be used for detected surface changes in the liner, the setting can simply be set to on. Chamber part 506 is defined to be confinement rings. Loop control is also set to off, based on the fact that the tool model is predicting that changes in material buildup in the confinement rings is not causing any changes or drifts in the process performance.

These example graphical user interface controls and settings have been shown to illustrate how the information contained in the tool model for specific processes can be used by tool operators, to control when loop control should be applied during active processing of substrates. That is, it is possible that the operator knowing that the tool model is suggesting minimal impact to the process performance by specific component parts, may choose to prevent the system to apply loop control and change parameters. In other parts of the chamber, e.g., the focus ring 502, the operator can actively set loop control on, since the tool model is predicting substantially more drift in process performance as polymer buildup and/or wear is exhibited by the focus ring.

Figure 11:
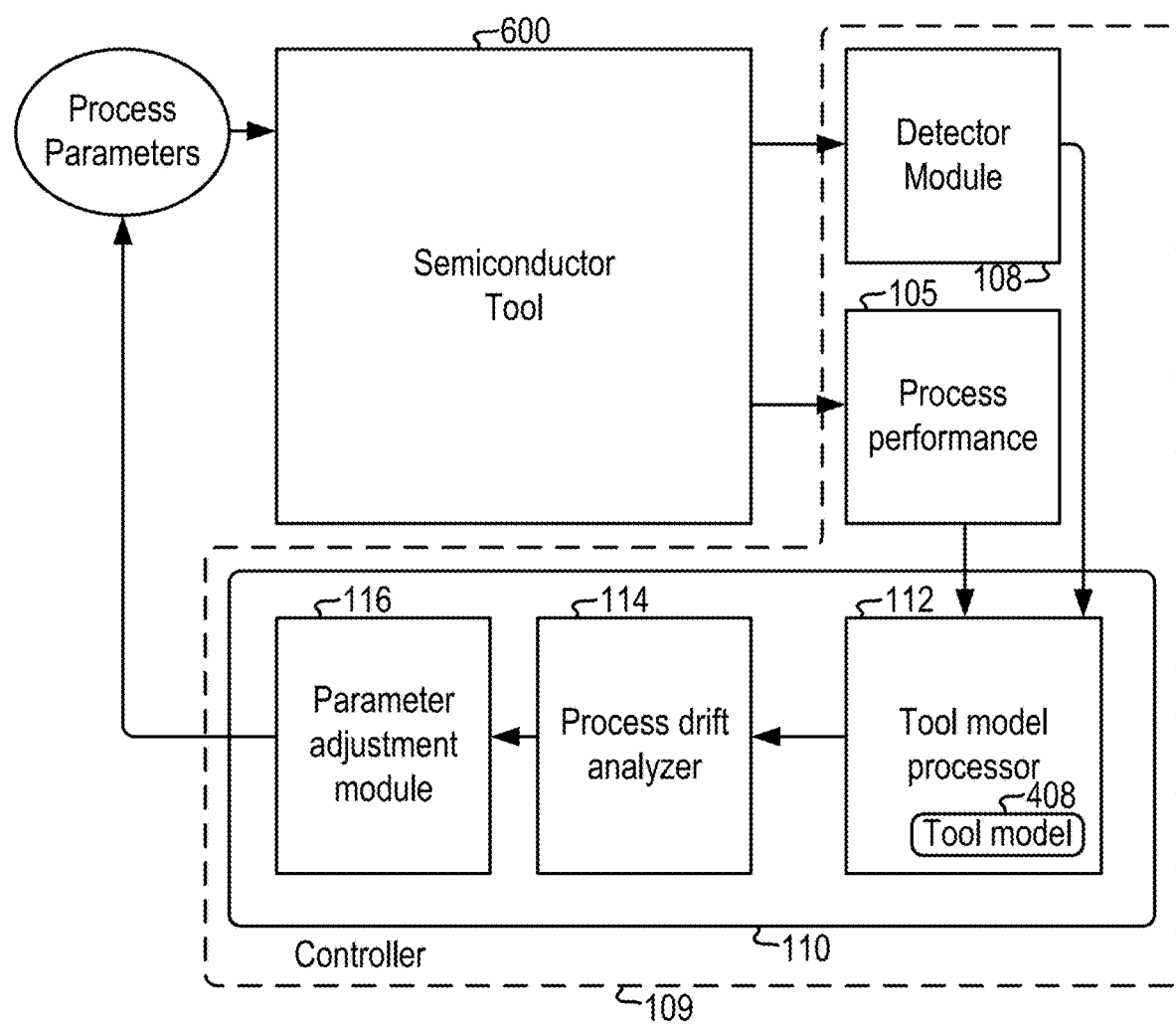
FIG. 11 illustrates a block diagram of loop control, usable to actively change process parameters utilized by semiconductor tool, to optimize processing and extend the time between wet clean operations.

FIG. 11 illustrates a block diagram of loop control 110, usable to actively change process parameters utilized by semiconductor tool 600. In this embodiment, it is shown that a detector module 108, can gather information from the surfaces of the semiconductor tool 600, and provide that information to the tool model processor 112. The tool model processor 112 is configured to generate tool model 408. Tool model 408 includes correlated information associated with process performance 105, which has been gathered from processing one or more substrates in the semiconductor tool 600. In operation, the tool model 408 may simply be used based on detected changes to specific parts within the semiconductor tool 600, which can then predict process drift.

Thus, process performance 105 need not be performed each time, and simply could be performed to generate the tool model 408. Once the tool model for weight is generated or used or obtained, the detector module 108 is simply used to gather characteristics of the inside of the chamber, and then use the tool model to predict what the process performance would be. This predicted process performance is analyzed by the process drift analyzer 114, which then interacts with parameter adjustment module 116. Parameter adjustment module 116 can identify one or more parameters of the process recipe to adjust, and therefore provides this information as a closed loop control function.

In one embodiment, the closed loop control 110 as well as the detector module 108 and the process performance 105 can be controlled by the controller 109. In some embodiments, the controller 109 can process these modules in the form of software or hardware. In other embodiments, the controller 109 simply interfaces with other modules, such as detector module 108 to instruct the gathering of information from within the semiconductor tool 600. In some embodiments, the process performance 105 is retrieved from another tool, such as a metrology tool.

As can be appreciated, the detector module 108, once the tool model has been constructed, can be used to inspect the semiconductor tool 102 periodically, or based on some programmed rate. Based on the information gathered by the detector module 108, the tool model can be used to predict what the process performance will be. If the process performance is predicted to be drifting or to possibly exhibit drift or shifts, specific parameters of a recipe can be programmatically adjusted, to compensate for the drift or shift that is expected. In this manner, it is possible to extend the processing of the semiconductor tool 102 of more substrates 104, and the processing of the substrates 104 can maintain a desired process performance level throughout or substantially throughout the entire period of time between wet cleans.

In one embodiment, the controller 109, described with reference to FIG. 1 above may include a processor, memory, software logic, hardware logic and input and output subsystems from communicating with, monitoring and controlling a plasma processing system 100. The controller 109 may also handle processing of one or more recipes including multiple set points for various operating parameters (e.g., voltage, current, frequency, pressure, flow rate, power, temperature, etc.), e.g., for operating a plasma processing system.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
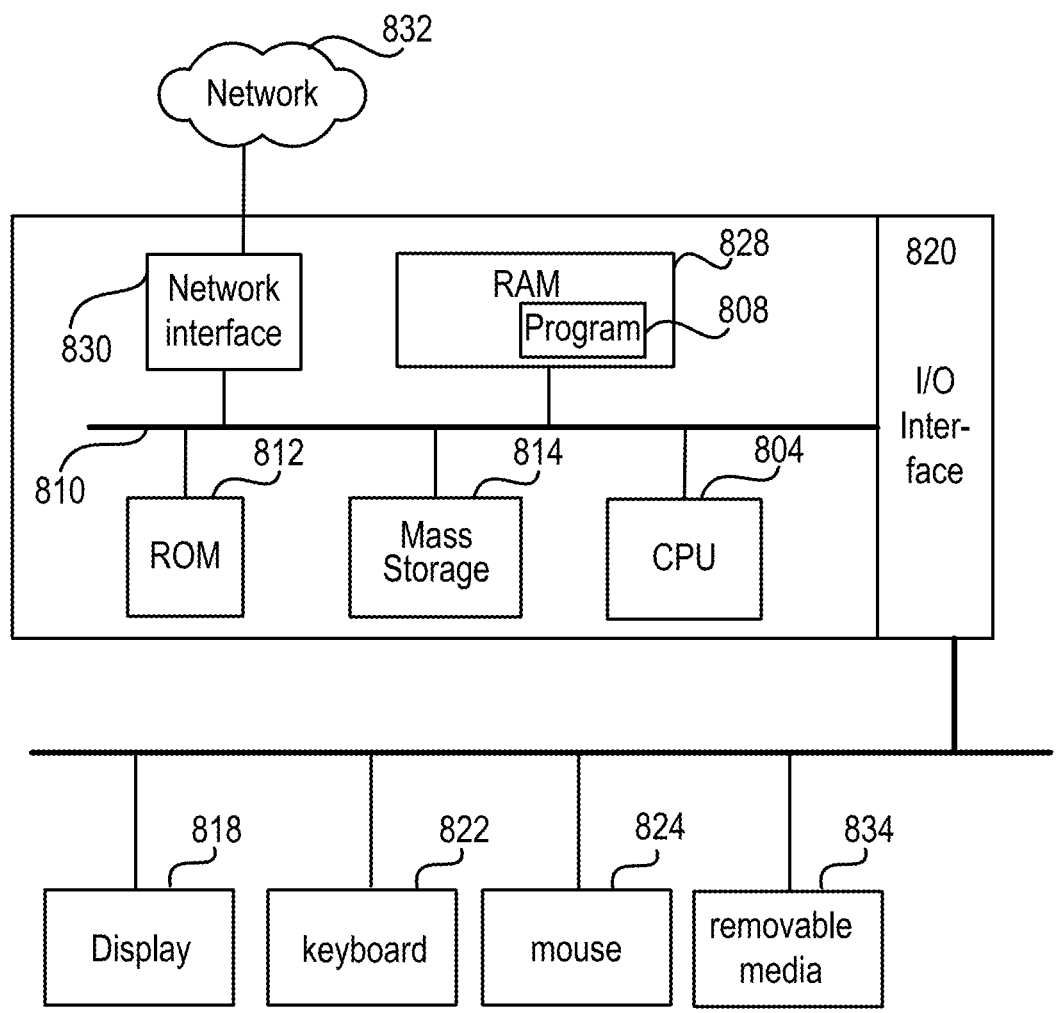
FIG. 12 is a simplified schematic diagram of a computer system for implementing embodiments.

FIG. 12 is a simplified schematic diagram of a computer system for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 828, read-only memory (ROM) 812, and mass storage device 814. System controller program 808 resides in random access memory (RAM) 806, but can also reside in mass storage device 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 828, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

For more information regarding methods for inspecting process chambers and consumable parts, reference may be made to U.S. patent application Ser. No. 14/961,756, filed on Dec. 7, 2015 and entitled "Estimation of Lifetime Remaining for Consumable Part in a Semiconductor Manufacturing Chamber," which is incorporated by reference herein. Embodiments and features described in the above incorporated by reference application may be combined with one or more features described herein, to define specific embodiments.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma processing system including a chamber having an interior region that is exposed to plasma when processing a substrate, the internal region includes surfaces of parts of the chamber, the plasma processing system comprising,
   a controller interfaced with the chamber, the controller including,
      a detector interfaced with the chamber to enable control of a scope, the scope is configured for insertion into the chamber to inspect the interior region of the chamber without breaking a vacuum of the chamber, the detector includes an optical processor for identifying a characteristic of material present on a surface being inspected via the scope in between processing of the substrate, and the scope includes,
         a face having an emitter disposed thereon for emitting light wave signals toward the surface being inspected, the surface is of a part in the chamber, and
         a sensor integrated in the face of the scope and disposed proximate to said emitter, the sensor is for capturing reflected wavelengths of light emanating from said surface of said part;
      a positioning system for moving the scope and said face of the scope toward or away from said surface and angling said face of the scope toward other surfaces of parts in said chamber;
      a tool model processor configured to receive information regarding the identified characteristic of the material present on the surface and interface with a tool model for the chamber to identify an adjustment to a parameter of a process to be performed using the chamber;
      wherein the adjustment is configured to compensate for an anticipated drift in in the process based on the identified characteristic of the material present on the surface and data from the tool model.

2. The plasma processing apparatus of claim 1, wherein the positioning system is configured to move the scope into the internal region in between processing of substrates and move the scope out of the internal region during processing of substrates.

3. The plasma processing apparatus of claim 1, wherein the tool model is constructed over time from inspections of one or more substrates for process performance and correlations to characteristics of material present on the surface.

4. The plasma processing apparatus of claim 1, wherein the tool model is updated by the tool model processor after processing one or more additional substrates.

5. The plasma processing apparatus of claim 1, wherein the scope is interfaced with the chamber via an isolation valve.

6. A plasma processing system, comprising,
   a chamber having an interior region that is exposed to plasma when processing a substrate, the internal region includes surfaces of consumable parts of the chamber;
   a controller, including,
      a detector being interfaced with the chamber to enable control of a scope, the scope is configured for insertion into the chamber to inspect the interior region of the chamber without breaking a vacuum of the chamber, and data obtained from the detector is used to identify a characteristic of material present on a surface being inspected via the scope in between processing of the substrate, and the scope includes,
         a face having an emitter disposed thereon for emitting light wave signals toward the surface being inspected, the surface is of the consumable part of the chamber, and
         a sensor integrated in the face of the scope and disposed to said emitter, the sensor is for capturing reflected wavelengths of light emanating from said surface of said consumable part;
      a positioning system for moving the scope and said face of the scope toward or away from said surface, and angling said face of the scope toward said surface of said consumable part;
      a tool model processor configured to receive information regarding the identified characteristic of the material present on the surface and interface with a tool model for the plasma processing system to identify an adjustment to a process to be performed by the plasma processing system, wherein the adjustment is configured to compensate for anticipated drift based on the identified characteristic of the material present on the surface and data from the tool model.

7. The plasma processing system of claim 6, wherein the positioning system is configured to move the scope into the internal region in between processing of substrates and move the scope out of the internal region during processing of substrates.

8. The plasma processing system of claim 6, wherein the tool model is constructed from inspections of one or more substrates for process performance and correlations to characteristics of material present on the surface.

9. The plasma processing system of claim 8, wherein the tool model is updated by the tool model processor after processing one or more additional substrates.

10. The plasma processing system of claim 8, wherein the scope is interfaced with the chamber via an isolation valve.

11. A plasma processing system, comprising,
    a chamber having an interior region that is exposed to plasma when processing a substrate, the internal region includes surfaces of structures of the chamber and surfaces of consumable parts of the chamber;
    a controller interfaced with the chamber for controlling processing of a recipe to be used when processing the substrate, the recipe defines a plurality of parameters to be set for supplying chemistries and setting conditions of the chamber;
    a detector being interfaced with the chamber to enable control of a scope, the scope is configured for insertion into the chamber to inspect the interior region of the chamber without breaking a vacuum of the chamber, and data from the detector is used to identify a characteristic of material present on the surface being inspected via the scope, and the scope includes, a face having an emitter disposed thereon for emitting light wave signals toward the surface being inspected, the surface is of a consumable part of the chamber, and a sensor integrated in the face of the scope and disposed proximate to said emitter, the sensor is for capturing reflected wavelengths of light emanating from said surface of said consumable part;

a positioning system configured for moving the face of the scope to one or more locations including angling the face of the scope to be directed toward the consumable part or other consumable parts of the internal region of the chamber, the positioning system configured to move the scope into the internal region in between processing of substrates and move the scope out of the internal region during processing of substrates;

a tool model processor configured to receive information regarding the identified characteristic of the material present on the surface and information regarding a process performance of the recipe obtained from an inspection of one or more substrates to construct a tool model, the tool model maintains correlations between the characteristic of the material present on the surface and information regarding the process performance of the recipe;

wherein tool model is updated by the tool model processor when processing one or more additional substrates.

12. The plasma processing system of claim 11, wherein the detector further includes, an image processor that is interfaced with a camera, the camera being integrated with the scope, the camera is configured to capture images of surfaces of the internal region of the chamber, and information regarding the captured images of the surface is added to the tool model, the tool model processor is configured to perform comparisons of two or more of said captured images to identify further characteristics of surfaces internal to the region of the chamber, the characteristics identified from the captured images being correlated to the information regarding the process performance of the recipe.

13. The plasma processing system of claim 11, further comprising an optical processor configured to control emission of the light wave signals in an ultraviolet-infrared range, and reflected wavelengths of light is captured by the sensor or sensors of the scope, and an optical detector is used to sample the reflected wavelengths of light for processing by the optical processor.

14. The plasma processing system of claim 13, wherein the reflected wavelengths of light processed by the optical processor is configured to provide information that is corresponded to predefined surface conditions.

15. The plasma processing system of claim 11, wherein the scope is interfaced with the chamber via an isolation valve.

16. The plasma processing system of claim 11, wherein the controller is configured to process or interface with the tool model processor.

17. The plasma processing system of claim 11, further comprising, a process drift analyzer for identifying criteria of when the processing of substrates has drifted outside of an acceptable window for the recipe.

* * * * *